(12) United States Patent
Ku et al.

(10) Patent No.: US 6,285,603 B1
(45) Date of Patent: Sep. 4, 2001

(54) REPAIR CIRCUIT OF SEMICONDUCTOR MEMORY DEVICE

(75) Inventors: Kie-bong Ku, Kyunggi-do; Tae-yun Kim, Choongchungpook-do, both of (KR)

(73) Assignee: Hyundai Electronics Industries Co., Ltd., Kyunggi-do (KR)

( * ) Notice: Subject to any disclaimer, the term of this patent is extended or adjusted under 35 U.S.C. 154(b) by 0 days.

(21) Appl. No.: 09/476,688

(22) Filed: Dec. 30, 1999

(30) Foreign Application Priority Data

Dec. 30, 1998 (KR) .................................................. 98-62537

(51) Int. Cl.$^7$ ..................................................... G11C 7/00
(52) U.S. Cl. ........................................ 365/200; 365/225.7
(58) Field of Search ................................. 365/200, 225.7

(56) References Cited

U.S. PATENT DOCUMENTS

| | | | |
|---|---|---|---|
| 5,502,674 | 3/1996 | Griffus et al. | 365/200 |
| 5,825,697 | 10/1998 | Gilliam et al. | 365/200 |
| 5,838,625 | 11/1998 | Cutter et al. | 365/225.7 |
| 5,841,712 | 11/1998 | Wendell et al. | 365/200 |
| 5,875,144 | 2/1999 | Zheng | 365/225.7 |
| 5,901,105 * | 5/1999 | Ong et al. | 365/230.06 |
| 5,917,763 | 6/1999 | Mullarky | 365/200 |
| 5,920,516 | 7/1999 | Gilliam et al. | 365/200 |

* cited by examiner

Primary Examiner—David Nelms
Assistant Examiner—M. Tran
(74) Attorney, Agent, or Firm—Crompton, Seager & Tufte, LLC

(57) ABSTRACT

A repair circuit of a semiconductor memory device utilizes a plurality of current blocking circuits, each provided with a programmable anti-fuse, to reduce current consumption in DRAM devices, particularly during a normal operation mode. The repair circuit includes a first operation switch having an output for outputting a supply voltage in accordance with a CAS-before-RAS signal; a first fuse selector, including a first plurality of fuses connected to the output of the first operation switch, to output a sub-block select signal in accordance with the output voltage of the first operation switch and a spare column enable signal; a second operation switch having an output for outputting the supply voltage in accordance with the sub-block select signal output from the first fuse selector and an address transition detection signal for performing a pre-charge function during a normal operation mode of a DRAM device; and a second fuse selector, including a second plurality of fuses connected to the output of the second operation switch, to generate a repair column select signal in accordance with the sub-block select signal output from the first fuse selector. The current blocking circuit generate a repair value signal for controlling the operation of one or the other operation switch based on a programming status of the anti-fuse.

19 Claims, 7 Drawing Sheets

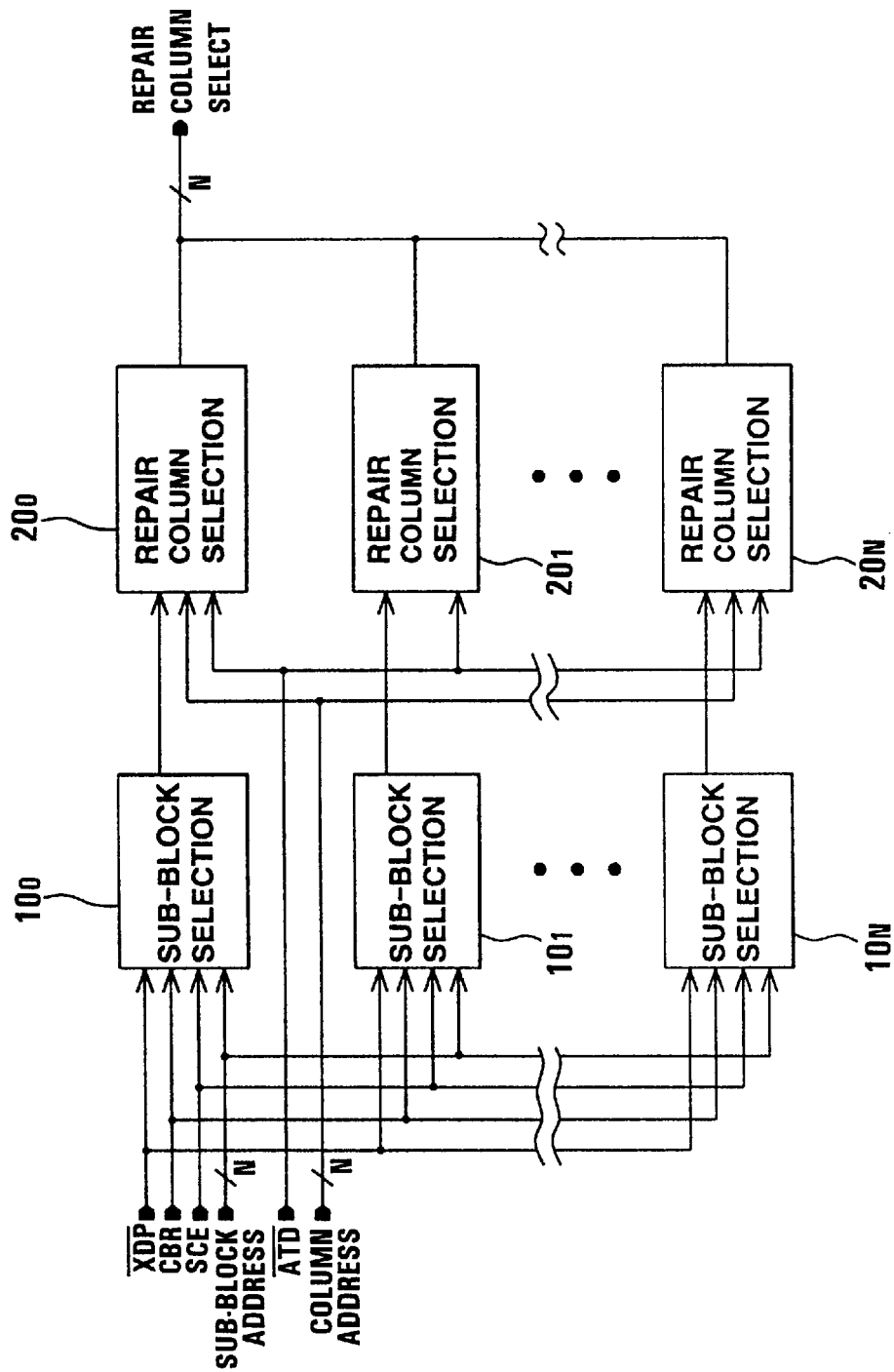

REPAIR CIRCUIT OF SEMICONDUCTOR MEMORY DEVICE

BACKGROUND OF THE INVENTION

1. Field of the Invention

The present invention relates to a repair circuit of a semiconductor memory device, such a DRAM device, and more particularly to a repair circuit of a semiconductor memory device in which a programmed anti-fuse is used to reduce a current consumption by a plurality of fuse selectors.

2. Discussion of the Related Art

If even one of a large number of defined cells in a semiconductor memory device is defective in its operation, the memory device as a whole rust be treated as a defective (unusable) product, because the device cannot be normally operated as a dynamic random access memory (DRAM). It is, however, highly impractical to discard the entire memory device when only a very few of the defined cells are actually defective, which is especially true as the integration of a DRAM device increases. Therefore, when defective cells are present, which is an inevitable occurrence, such cells are replaced with spare or “redundant” memory cells. The redundant memory cells are embedded (pre-installed) within a manufactured DRAM device, in the form a redundancy circuit, for the express purpose of replacing all identified defective cells and thereby improving the yield of the final product.

The adverse result of this universal provision of redundant memory cells is an undesirable increase of the area of a given chip, which in turn increases the complexity of the test for identifying the defective cells themselves, as well as an increase in current consumption. Nevertheless, such a technique of installing a redundancy circuit is generally used in 64~256 Kb DRAMs as a standard practice, since the increased chip area and current consumption is not excessive. Typically, a redundancy circuit for a memory cell is pre-installed in each sub-array block, whereby spare rows and columns are established, thereby enabling the replacement of each defective cell with a redundant memory cell in a row/column when cell defects are identified.

To identify the defective memory cells, an electrical test is performed to check each memory cell of every memory device of a completed waifer. Then, the memory devices are “reprogrammed” using a repair circuit to effectively change the addresses of the defective cells, such that when the address signal for a defective cell is selected, a spare (replacement) cell is internally addressed in its place. In doing so, when the defective addresses are input to the memory device during it, actual operation, preinstalled alternative address lines are selected instead of the addresses originally corresponding to defective lines.

Such a programming method can be achieved by one of several methods: by burning open a pre-installed fuse using a current overload, as an ordinary electrical fuse; using a laser beam to cut traces (polysilicon or metal wirings) in order to create an electrical open or an electrical short; or by programming an EPROM memory cell. Among these methods, the laser cutting method is simple and precise and therefore widely used. The repair circuit of the present invention, for example, adopts the laser cutting method for fuse programming.

FIG. 1A is a block diagram illustrating a conventional repair circuit of a semiconductor memory device. The conventional repair circuit includes a plurality of circuits $\mathbf{10}_0$~$\mathbf{10}_n$ for the selection of redundant cells by sub-block, in accordance with a sub-block address signal. This selection, which additionally requires a CAS-before-RAS (CBR) signal, a spare column enable (SCE) signal, and an inverted row-decoder precharge signal $\overline{XDP}$ which is an adapted row address strobe (RAS) signal, is based on a programming of n sub-blocks of fuses. A plurality of circuits $\mathbf{20}_0$~$\mathbf{20}_n$ is also included for the selection of redundant cells by repair column, by generating n repair column select signals to select columns of redundant cells in response to a column address signal and an inverted address transition detection signal $\overline{ATD}$. Thus, columns of redundant cells of the selected sub-block of redundant cells are selected.

Referring to FIG. 1B, which details a functioning pair of the fuse selectors ($\mathbf{10}_n$ and $\mathbf{20}_n$), each sub-block selector 10 comprises a first fuse selector 16 for selecting sub-blocks based on the sub-block address signals; a first operation switch 12 for controlling the supply of a supply voltage (Vcc) based on the CBR signal, which enables the first fuse selector; and a first latch 14 which, in accordance with a logical NOR operation of the voltage at a node “a” and that of the $\overline{XDP}$ signal, controls the output of the first operation switch, in order to stabilize the output voltage of the first fuse selector. Meanwhile, each repair column selector 20 comprises a second fuse selector 26 for generating a repair column select signal in response to a column address signal; a second operation switch 22 for controlling the supply of the supply voltage based on an output value of the first fuse selector 16, in order to operate the second fuse selector; and a second latch 24 for stabilizing the output voltage of the second fuse selector, by latching the voltage at a node “b” using the supply voltage. Here, the fuses, which are to be programmed by, for example, laser cutting, are depicted as wide black lines in series with a plurality of NMOS transistors connected in parallel.

In the operation of the conventional repair circuit thus constructed, the CBR signal increases the internal address and performs a refresh process for each address. Thus, in the CBR mode, which corresponds to the refresh cycle wherein the CBR signal is in the logic low state, the repair column select signal is not activated as no repair is needed.

Since the $\overline{XDP}$ signal is a serial RAS signal which starts out at a high level, the NOR gate of the first latch 14 initially transmits a logic low back to the first operation switch 12. At this time, to enable circuit operation, the first operation switch 12 is activated by a low-level CBR signal, thus charging node “a” to the supply voltage level. Therefore, the NOR gate of the first latch 14 latches the gate signal to a PMOS transistor of the first operation switch 12 at a low level.

In a normal operation mode, before the sub-block and column address signals are input to the first and second fuse selectors 16 and 26, respectively, none of the fuses of the first fuse selector have been cut, so that node “a” floats high, i.e., at the supply voltage level. At this time, the SCE signal is also high, so that a NAND gate 16*a* transmits a logic low to the repair column selector 20, specifically, to the gate of one of two series-connected PMOS transistors of the second operation switch 22, thereby turning on the transistor. Meanwhile, being input to the gate of the other PMOS transistor, the $\overline{ATD}$ signal is also low, temporarily, before a sub-block address is input, thus charging node “b” to a high level. Then, the operation of the second latch 24 latches the voltage of node “b” to the supply voltage level, a high level.

Later, when accessing memory cells, the circuit operates according to the cut status (programming) of the fuses of the first and second fuse selectors 16 and 26. In the event that no repair process is performed, a current path to ground is formed through the fuses and NMOS transistors of the first and second fuse selectors 16 and 26, to thereby consume current due to the supply voltage charge at nodes "a" and "b" in the normal operation as described above. In other words, if a RAS signal (CBR signal) continues to alternate between its active and charging states in the course of DRAM memory device operation, nodes "a" and "b" continuously repeat a cycle of charging in the normal operation and discharging in an access operation.

Therefore, the conventional repair circuit consumes current unnecessarily in both fuse selectors. Furthermore, this unnecessary current consumption increases in direct proportion to an increase in the number of fuse selectors.

SUMMARY OF THE INVENTION

Therefore, it is an object of the present invention to provide a repair circuit of a semiconductor memory device, which can reduce current consumption by the repair circuit.

It is another object of the present invention to provide a repair circuit of a semiconductor memory device, which can prevent an unnecessary current consumption caused by a formation of a current path at fuses of the repair circuit when an access operation is performed for normal cells.

It is still another object of the present invention to provide a repair circuit of a semiconductor memory device, which can prevent current from being supplied to the fuse selectors during normal operation.

In order to accomplish the aforementioned object of the present invention, there is provided a repair circuit of a semiconductor memory device comprising: a first operation switch having an output for outputting a supply voltage in accordance with a CAS-before-RAS signal; a first fuse selector, including a first plurality of fuses connected to the output of the first operation switch, to output a sub-block select signal in accordance with the output voltage of the first operation switch and a spare column enable signal; a second operation switch having an output for outputting the supply voltage in accordance with the sub-block select signal output from the first fuse selector and an address transition detection signal for performing a pre-charge function during, a normal operation mode of a DRAM device; and a second fuse selector, including a second plurality of fuses connected to the output of the second operation switch, to generate a repair column select signal in accordance with the sub-block select signal output from the first fuse selector The repair circuit of the present invention also comprises a current blocking circuit, including a programmable anti-fuse, to generate a repair value signal for controlling the operation of one or the other of operation switches based on a programming status of the anti-fuse. When the current blocking circuit is connected to the second operation switch, current consumption in the second fuse selector is saved in the normal mode. On the other hand, when the current blocking circuit is connected to the first operation switch, current consumption in both fuse selectors is saved in the normal mode, due to a modification of the second operation switch.

BRIEF DESCRIPTION OF THE DRAWINGS

The present invention will now be described in detail with reference to the accompanying drawings, which are included to provide a further understanding of the invention and are incorporated in and constitute a part of this specification in order to illustrate embodiments of the invention, and which, together with the following detailed description, serve to explain the principles of the invention. In the drawings:

FIG. 1A is a block diagram schematic of a conventional repair circuit;

DETAILED DESCRIPTION OF THE PREFERRED EMBODIMENTS

Figure 1B:
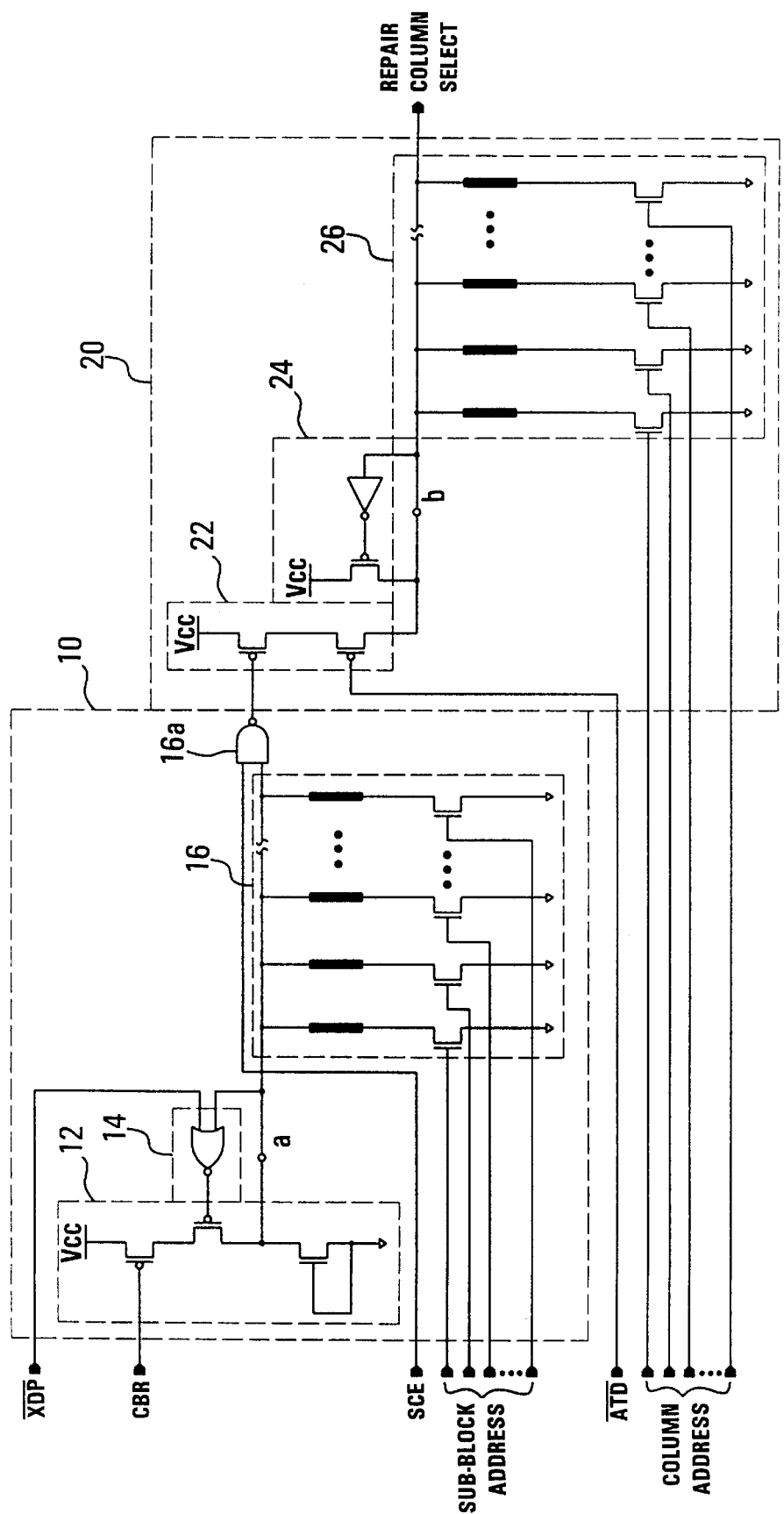
FIG. 1B is a detailed schematic of the repair circuit shown in FIG. 1A.
Figure 2A:
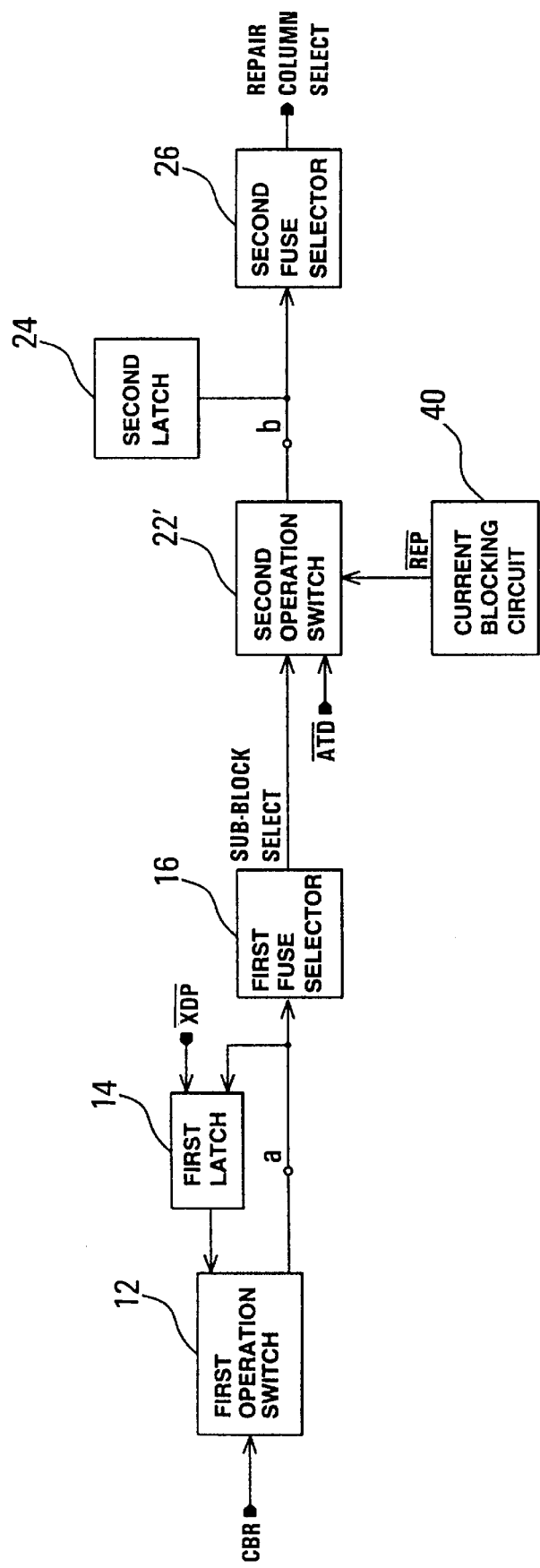
FIG. 2A is a block diagram schematic of a repair circuit of a semiconductor memory device in accordance with a first preferred embodiment of the present invention.

As shown in FIG. 2A, the repair circuit in accordance with a first preferred embodiment of the present invention includes a first operation switch 12, a first latch 14, a first fuse selector 16, a second latch 24, and a second fuse selector 26. These circuit components correspond to circuit components used conventionally. In addition, a second operation switch 22', being connected to a supply voltage (Vcc), is provided to control the second fuse selector 26 in accordance with an output voltage of the first fuse selector 16, and a current blocking circuit 40 is provided to control the operation of the second operation switch 22' by generating an inverted repair value signal $\overline{REP}$ in accordance with the status of an anti-fuse.

Figure 2B:
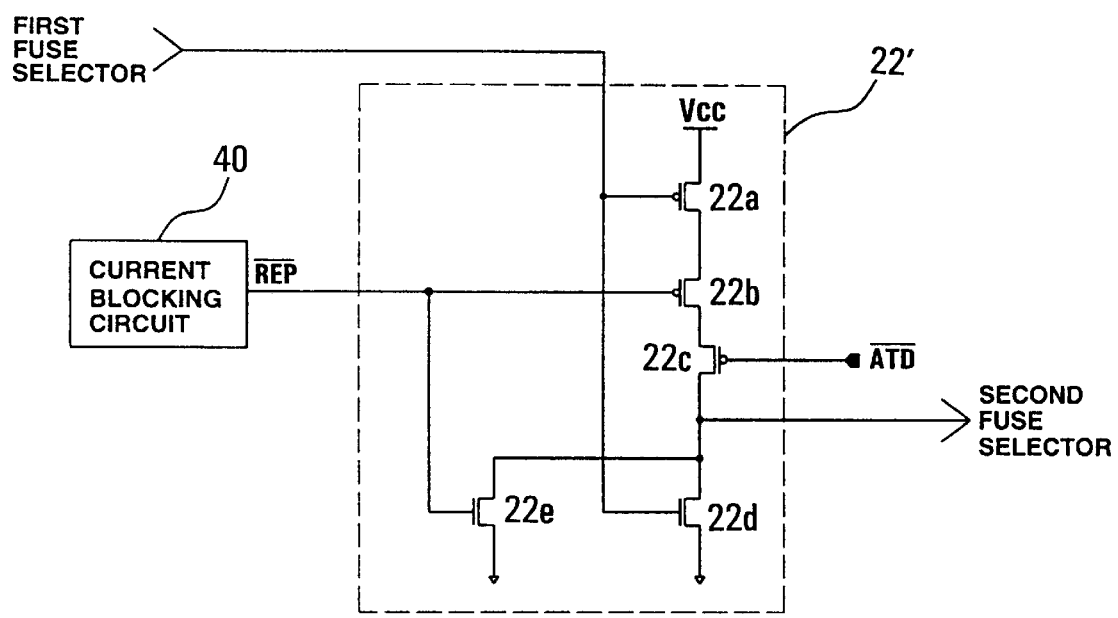
FIG. 2B is a detailed schematic of the second operation switch shown in FIG. 2A.

As shown in FIG. 2B, the second operation switch 22' is a configuration of PMOS transistors 22a~22c and NMOS transistors 22d and 22e. The transistors 22a~22d are connected in series between the supply voltage and ground, and the transistor 22e is connected in parallel to the output node of the second operation switch 22'. The gates of transistors 22a and 22d are controlled by the output signal of the first fuse selector 16; the gates of the transistors 22b and 22e are controlled by the $\overline{REP}$ signal output from the current blocking circuit 40; and the gate of the transistor 22c is controlled by the $\overline{ATD}$ signal, to charge node "b" and, in turn, the output of the second fuse selector 26.

In the operation of the above repair circuit according to the first preferred embodiment, when a repair operation is to be performed, the current blocking circuit 40 transmits a low-level inverted repair value $\overline{REP}$ to the transistors 22b and 22e of the second operation switch 22'. Meanwhile, the first fuse selector 16 transmits a logic low sub-block select signal to the second operation switch 22', specifically, to the gates of the transistors 22a and 22d, turning on the former and turning of the latter. At this time, however, the transistor 22c has turned off in accordance with the application of the $\overline{ATD}$ signal input, to maintain node "b" at a high level. Thus, as the second fuse selector 26 outputs a high-level repair column select signal, the column having a defective memory cell is replaced with a redundant column.

On the other hand, during normal operation, an anti-fuse of the current blocking circuit 40 is not programmed (described later), so that the $\overline{REP}$ signal output is high. Thus, in the second operation switch 22', the transistor 22b is turned off and the transistor 22e is turned on. Therefore, since the supply voltage is not supplied to node "b" and the second fuse selector 26, there is no current consumption in the second fuse selector.

When no repair process is to be performed, the first fuse selector 16 outputs a logic high sub-block select signal to the second operation switch 22', turning off the transistor 22b and turning on the transistor 22e. Thus, the supply voltage is not supplied to node "b" and the second fuse selector 26, whereby a low-level repair column select signal is output so that the normal cells may be accessed.

Figure 3A:
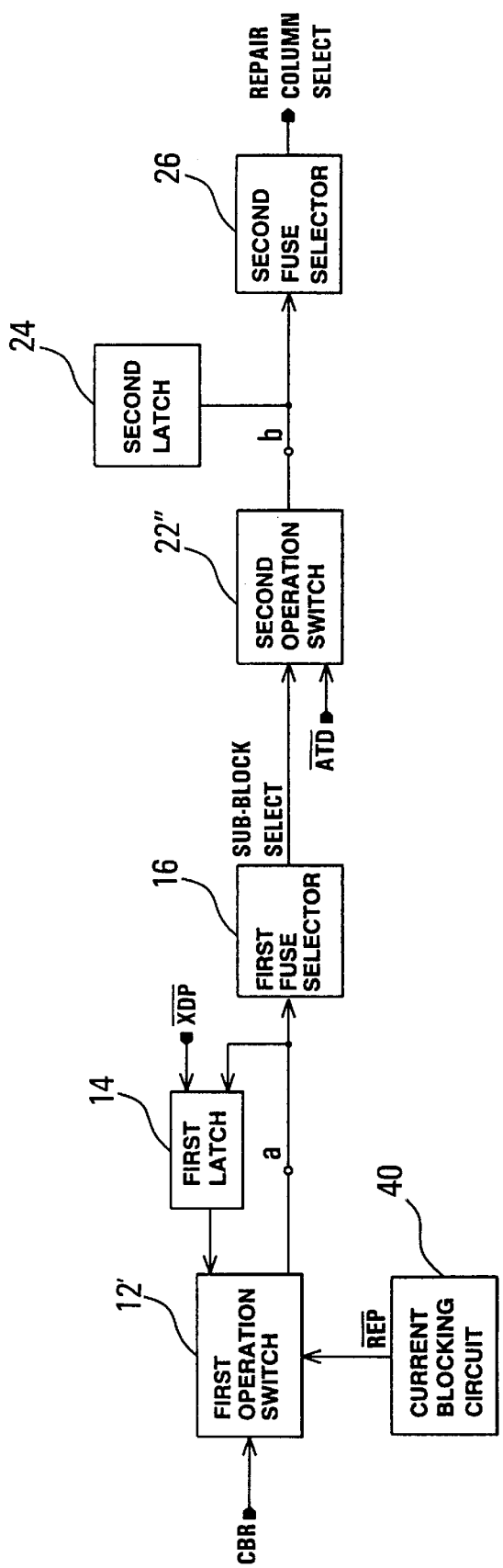
FIG. 3A is a block diagram schematic of a repair circuit of a semiconductor memory device in accordance with a second preferred embodiment of the present invention.

As shown in FIG. 3A, the repair circuit in accordance with a second preferred embodiment of the present invention includes a current blocking circuit 40 for outputting an inverted repair value signal $\overline{REP}$ to the first operation switch. By connecting the current blocking circuit 40 to the sub-block portion the repair circuit, a reduction in current consumption is achieved for the first fuse selector. To do so, a first operation switch 12' is provided to control the supply voltage output to the first fuse selector 16 in accordance with the CBR signal input. As in the first preferred embodiment, the other circuit components may be constructed in the conventional manner.

Figure 3B:
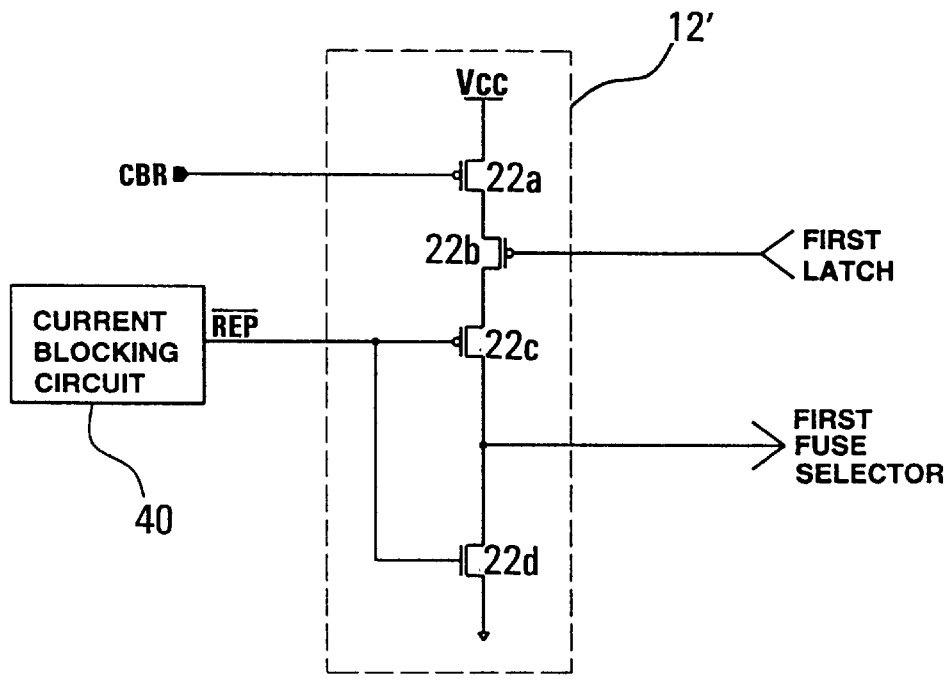
FIGS. 3B and 3C are a detailed schematics of the first and second operation switches shown in FIG. 3A.
Figure 3C:
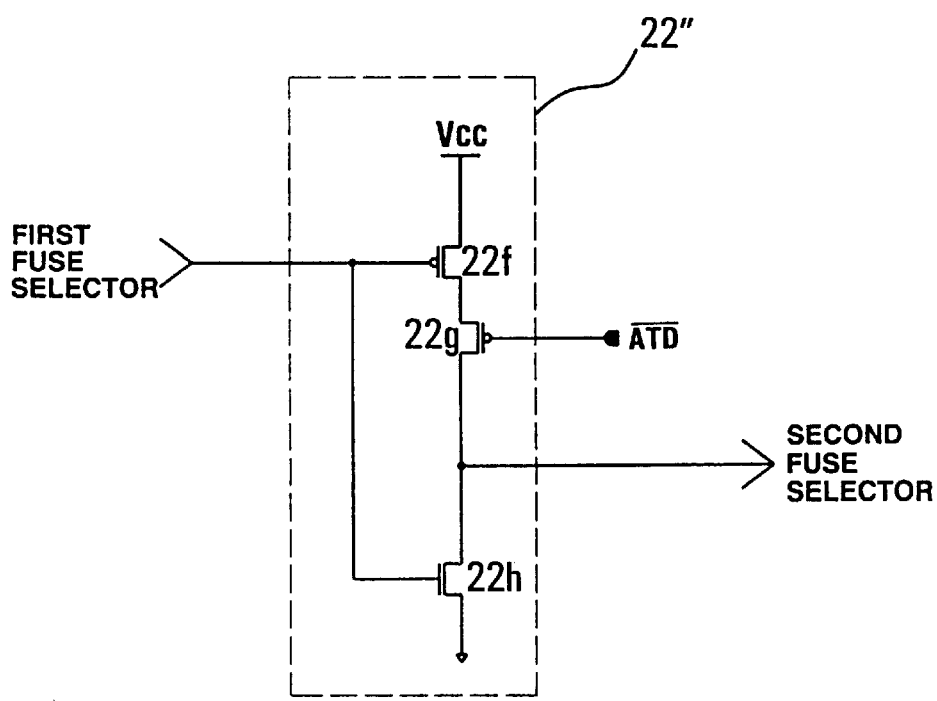

As shown in FIG. 3B, the first operation switch 12' is, a configuration of PMOS transistors 12a, 12b, and 12c and an NMOS transistor 12d, connected in series between the supply voltage and ground. The gate of the transistor 12a is controlled by the CBR signal, the gate of the transistor 12b is controlled by the output signal of the first latch 14, and the gates of the transistors 12c and 12d are controlled by the inverted repair value signal $\overline{REP}$ output from the current blocking circuit 40. Furthermore, in order to eliminate the normal-operation current consumption in the second fuse selector 26 as well, a second operation switch 22" is embodied. The second operation switch 22" is constructed with PMOS transistors 22f and 22g and an NMOS transistor 22h connected in series between the supply voltage and ground, as shown in FIG. 3B. The transistors 22f and 22h are controlled by an output signal of the first fuse selector 16, and the transistor 22g is controlled by the $\overline{ATD}$ signal.

In the operation of the above repair circuit according to the second preferred embodiment, when a repair operation is to be performed, the current blocking circuit 40 transmits a low-level $\overline{REP}$ signal to the gates of the transistors 12c and 12d of the first operation switch 12'. At this time, as described above, the first fuse selector 16 transmits a low level to the gates of the transistors 22f and 22h of the second operation switch 22", and the second fuse selector 26 outputs a high-level repair column select signal. As a result, the column of a defective memory cell is replaced with a redundant column.

During normal operation and in the case of no repair operation being performed, the current blocking circuit 40 transmits a high-level $\overline{REP}$ signal to the gates of the transistors 12a and 12d. Thus, the voltage at node "a" goes low, so that the first latch 16 transmits a high level to the transistors 22f and 22h. Consequently, the second fuse selector 26 outputs a high-level repair column select signal, so that normal cells may be accessed.

Figure 4:
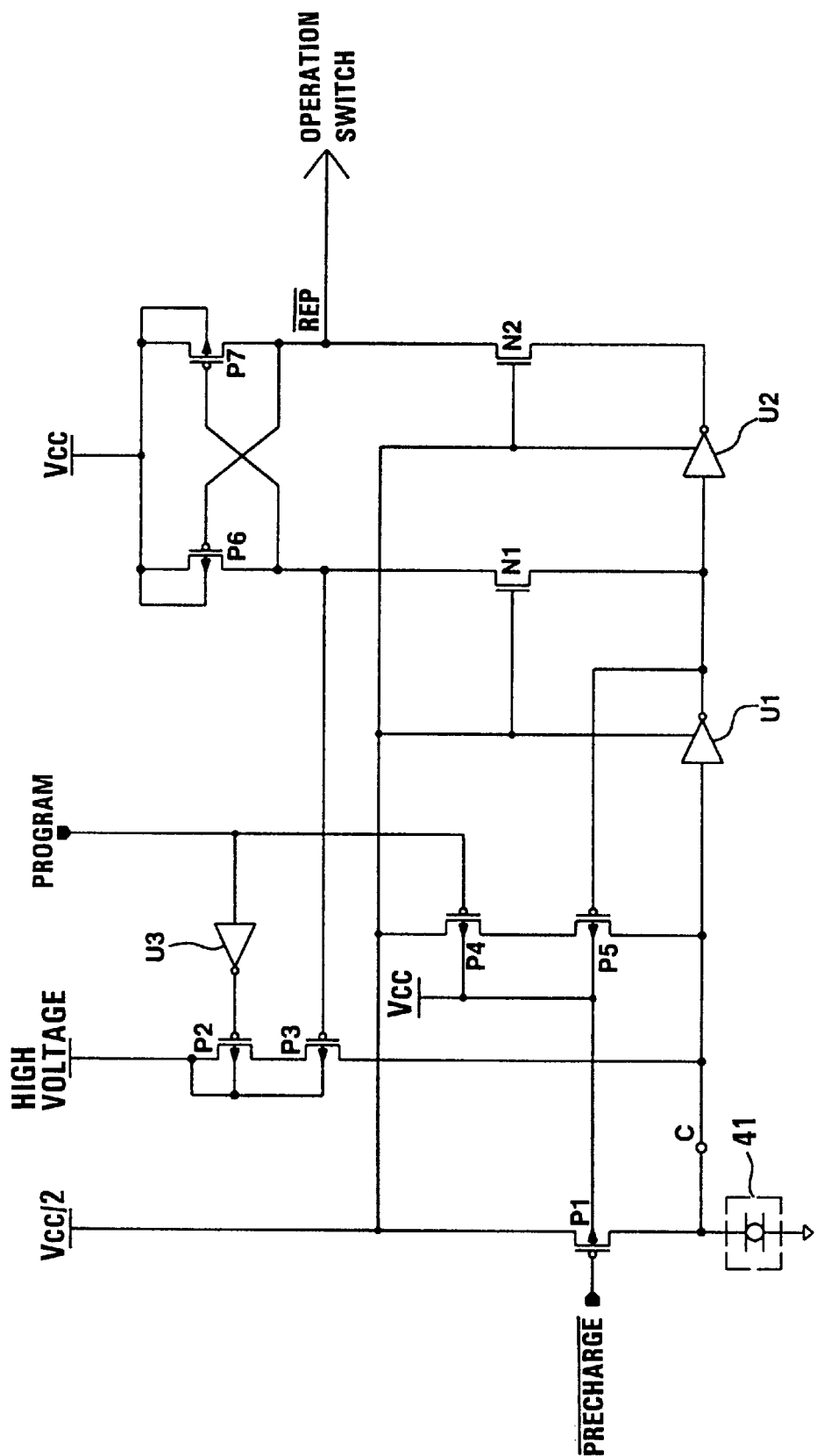
FIG. 4 is a detailed schematic of the current blocking circuit shown in FIGS. 2A & 2B and 3A & 3B.

FIG. 4 illustrates one example of the current blocking circuit 40 adopted by the present invention, which is the same circuit in both preferred embodiments of the present invention, utilizing an anti-fuse 41 programmed in accordance with a program signal. In addition to the anti-fuse 41, the current blocking circuit 40 comprises PMOS transistors P1~P7, NMOS transistors N1 and N2, and invertors U1, U2, and U3. Here, the invertor U3 is not essential to operation since the program signal may be supplied to the current blocking circuit 40 in both non-inverted and inverted forms.

Referring to FIG. 4, the transistor P1, connected in series between a half supply voltage (Vcc/2) and the anti-fuse 41, is controlled by an inverted precharge signal ($\overline{PRECHARGE}$) in order to pre-charge a node "c" in accordance with the programmed status of the anti-fuse. The invertors U1 and U2, each operating with respect to the half supply voltage, are connected in series connected between node "c" and the output of the current blocking circuit 40. The transistors P2 and P3 are connected in series between a high voltage source and node "c" and are turned on in order to supply the anti-fuse 41 with the necessary voltage level for programming in accordance with a program signal. The transistors P4 and P5 are connected in series between node "c" and the half supply voltage.

The program signal is used to control the transistors P2 and P4, and the transistor P5 is controlled by the output of the first invertor U1. The transistors P6 and P7 form a cross-coupled feedback loop for supplying the supply voltage to the gate of the transistor P3 and to an output node of the current blocking circuit 40. The transistors N1 and N2, arranged between PMOS transistors P6 and P7 and output terminals of invertors U1 and U2, respectively, are controlled by the half supply voltage. The substrates of the transistors P1, P4, and P5 are biased at the supply voltage potential.

In the operation of the repair circuit having the current blocking circuit constructed as above, node "c" is pre-charged to the half supply voltage level, and an externally generated program signal is applied to the repair circuit as a logic low. At the same time, the high-level inverted program signal is transmitted to the gate of the transistor P2, so that node "c" is not supplied with the high voltage and is therefore not programmed. Thus, since node "c" is at a logic high voltage, the repair value $\overline{REP}$ output from the current blocking circuit 40, via the pair of invertors U1 and U2, goes high.

When a repair operation is to be performed, however, the current blocking circuit 40 transmits a low-level repair value $\overline{REP}$ to the first (12') or second (22") operation switch. In this case, a low-level precharge signal is transmitted to the transistor P1 to precharge node "c" to the half supply voltage level. Thus, the invertor U1 outputs a low-level signal to turn on the transistors P3 and P7. As a result, the current blocking circuit 40 transmits the supply voltage level as the $\overline{REP}$ signal through the transistor P7 to the operation switch. At this time, since the invertor U2 outputs a signal based on the half supply voltage level and the gate of the transistor N2 is held at the half supply voltage level, reverse current flow, i.e., from the transistor P6 back to the invertor U1, is prevented.

Next, in order to program the anti-fuse 41, a high-level program signal is input to the repair circuit. At this time, since an inverted, logic low program signal is transmitted to the gate of the transistor P2, the high voltage is supplied to node "c" to effectively short the anti-fuse 41. In other words, the anti-fuse is programmed, which sets the voltage at node "c" to its logic low level, and the invertors U1 and U2 output high-level and low-level signals, respectively. As a result, the current blocking circuit 40 outputs a low-level $\overline{REP}$ signal.

As described above, a current blocking circuit utilizing an anti-fuse is adopted in the repair circuit of the present invention, to thereby prevent current consumption in a plurality of fuse selectors during normal DRAM operation and in the event that no repair operation is performed to a sub-block of a semiconductor memory device.

Since the present invention may be embodied in various forms, without departing from the essential characteristics thereof, it should be understood that the above-described embodiment is not to be limited by any of the details of the foregoing description, unless otherwise specified, but should be construed only as defined in the appended claims. Thus, all modifications that fall within the scope of the claims are therefore intended to be embraced thereby.

What is claimed is:

1. A repair circuit of a semiconductor memory device comprising:
    a first operation switch having an output for outputting a supply voltage in accordance with a CAS-before-RAS signal;
    a first fuse selector, including a first plurality of fuses connected to the output of said first operation switch, to output a sub-block select signal in accordance with the output voltage of said first operation switch and a spare column enable signal;
    a second operation switch having an output for outputting the supply voltage in accordance with the sub-block select signal output from said first fuse selector and an address transition detection signal for performing a pre-charge function during a normal operation mode of a DRAM device;
    a second fuse selector, including a second plurality of fuses connected to the output of said second operation switch, to generate a repair column select signal in accordance with the sub-block select signal output from said first fuse selector; and
    a current blocking circuit, including a programmable anti-fuse, to generate a repair value signal for controlling the operation of said second operation switch based on a programming status of the anti-fuse.

2. The repair circuit as claimed in claim 1, further comprising a first latch for latching the output voltage of said first operation switch to a predetermined voltage level in accordance with a RAS signal.

3. The repair circuit as claimed in claim 2, wherein said first latch is comprised of a logical NOR gate whose input ports arc respectively tied to a row-decoder precharge signal and the output voltage of the said first operation switch.

4. The repair circuit as claimed in claim 1, further comprising a second latch, connected to said second fuse selector, to maintain the repair column select signal at a stable level.

5. The repair circuit as claimed in claim 4, wherein said second latch is comprised of a logical invertor connected in series with a gate of a PMOS transistor, the PMOS transistor being connected between the supply voltage and the output voltage of said second operation switch.

6. The repair circuit as claimed in claim 1, wherein said current blocking circuit comprises:
    an anti-fuse connected between a predetermined node and ground;
    a first PMOS transistor connected between a half supply voltage and said anti-fuse and controlled by an internal signal to pre-charge the predetermined node using the half supply voltage level;
    a second PMOS transistor connected between the predetermined node and a high voltage source and controlled by a fuse-programming signal:
    a third PMOS transistor connected in series with said second PMOS transistor;
    a fourth PMOS transistor connected between the half supply voltage and the predetermined node and controlled by said fuse-programming signal;
    a pair of logic invertors, connected in series, to sequentially invert based on the half supply voltage the level of the pre-charged voltage of the predetermined node;
    a fifth PMOS transistor connected in series with said fourth PMOS transistor, controlled by the inverted voltage level of the predetermined node;
    sixth and seventh PMOS transistors, connected to form a cross-coupled feedback loop, for supplying the supply voltage to a gate of said third PMOS transistor and to an output node of the current blocking circuit, respectively; and
    first and second NMOS transistors, connected between said sixth and seventh PMOS transistors and output terminals of said pair of logic invertors, respectively, each controlled by the half supply voltage.

7. The repair circuit as claimed in claim 6, wherein said first, fourth, and fifth PMOS transistors are biased using the supply voltage.

8. The repair circuit as claimed in claim 6, said current blocking circuit further comprising a third logical invertor to invert the fuse-programming signal for input to a gate of the third PMOS transistor.

9. The repair circuit as claimed in claim 1, wherein said second operation switch comprises:
    a first PMOS transistor and a first NMOS transistor, each being controlled by the sub-block select signal output from said first fuse selector;
    a second PMOS transistor and a second NMOS transistor, each controlled by the repair value signal generated by said current blocking circuit; and
    a third PMOS transistor controlled by the address transition detection signal,
    wherein said first, second, and third PMOS transistors and said first NMOS transistor are connected in series between the supply voltage and ground, and the second NMOS transistor is connected in parallel to an output node of said second fuse selector.

10. A repair circuit of a semiconductor memory device comprising:
    a first operation switch having an output for outputting a supply voltage in accordance with a CAS-before-RAS signal;
    a first fuse selector, including a first plurality of fuses connected to the output of said first operation switch, to output a sub-block select signal in accordance with the output voltage of said first operation switch and a spare column enable signal;
    a second operation switch having an output for outputting the supply voltage in accordance with the sub-block select signal output from said first fuse selector and an address transition detection signal for performing a pre-charge function during a normal operation mode of a DRAM device;
    a second fuse selector, including a second plurality of fuses connected to the output of said second operation switch, to generate a repair column select signal in accordance with the sub-block select signal output from said first fuse selector; and
    a current blocking circuit, including a programmable anti-fuse, to generate a repair value signal for controlling the operation of said first operation switch based on a programming status of the anti-fuse.

11. The repair circuit as claimed in claim 10, further comprising a first latch for latching the output voltage of said first operation switch to a predetermined voltage level in accordance with a RAS signal.

12. The repair circuit as claimed in claim 11, wherein said first latch is comprised of a logical NOR gate whose input ports are respectively tied to a row-decoder precharge signal and the output voltage of the said first operation switch.

13. The repair circuit as claimed in claim 10, further comprising a second latch, connected to said second fuse selector, to maintain the repair column select signal at a stable level.

14. The repair circuit as claimed in claim 13, wherein said second latch is comprised of a logical invertor connected in series with a gate of a PMOS transistor, the PMOS transistor being connected between the supply voltage and the output voltage of said second operation switch.

15. The repair circuit as claimed in claim 10, wherein said current blocking circuit comprises:

an anti-fuse connected between a predetermined node and ground;

a first PMOS transistor connected between a half supply voltage and said anti-fuse and controlled by an internal signal to pre-charge the predetermined node using the half supply voltage level;

a second PMOS transistor connected between the predetermined node and a high voltage source and controlled by a fuse-programming signal;

a third PMOS transistor connected in series with said second PMOS transistor;

a fourth PMOS transistor connected between the half supply voltage and the predetermined node and controlled by said fuse-programming signal;

a pair of logic invertors, connected in series, to sequentially invert based on the half supply voltage the level of the pre-charged voltage of the predetermined node;

a fifth PMOS transistor collected in series with said fourth PMOS transistor, controlled by the inverted voltage level of the predetermined node;

sixth and seventh PMOS transistors, connected to form a cross-coupled feedback loop, for supplying the supply voltage to a gate of said third PMOS transistor and to an output node of the current blocking circuit, respectively; and first and second NMOS transistors, connected between said sixth and seventh PMOS transistors and output terminals of said pair of logic invertors, respectively, each controlled by the half supply voltage.

16. The repair circuit as claimed in claim 15, wherein said first, fourth, and fifth PMOS transistors are biased using the supply voltage.

17. The repair circuit as claimed in claim 15, said current blocking circuit further comprising a third logical invertor to invert the fuse-programming signal for input to a gate of the third PMOS transistor.

18. The repair circuit as claimed in claim 10, wherein said first operation switch comprises:

a first PMOS transistor controlled by the CAS-before-RAS signal;

a second PMOS transistor connected in series with said first PMOS transistor and controlled by an latched voltage signal; and a series connection of a third PMOS transistor and an NMOS transistor, connected in series with said second PMOS transistor, having a common output node with said first fuse selector, each being controlled by the repair value output from said current blocking circuit.

19. The repair circuit as claimed in claim 10, wherein aid second operation switch comprises:

a first PMOS transistor connected to the supply voltage and controlled by the sub-block select signal output from said first fuse selector;

a second PMOS transistor connected in series with said first PMOS transistor and controlled by the address transition detection signal; and an NMOS transistor connected in series with said first and second PMOS transistors and controlled by the sub-block select signal output from said first fuse selector, wherein said second PMOS transistor and said NMOS transistor share a common output node with said second fuse selector.

* * * * *

UNITED STATES PATENT AND TRADEMARK OFFICE
CERTIFICATE OF CORRECTION

PATENT NO. : 6,285,603 B1
DATED : September 4, 2001
INVENTOR(S) : Kie-bong Ku et al.

It is certified that error appears in the above-identified patent and that said Letters Patent is hereby corrected as shown below:

Column 7, claim 3,
Line 43, delete "arc" and insert -- are --.

Column 9, claim 15,
Line 36, delete "collected" and insert -- connected --.

Column 10, claim 19,
Line 24, delete "aid" and insert -- said --.

Signed and Sealed this

Twelfth Day of March, 2002

JAMES E. ROGAN
*Director of the United States Patent and Trademark Office*

*Attest:*

*Attesting Officer*